United States Patent
Sortais et al.

(10) Patent No.: US 8,664,862 B2
(45) Date of Patent: Mar. 4, 2014

(54) LOW-POWER GASEOUS PLASMA SOURCE

(75) Inventors: Pascal Sortais, Meylan (FR); Thierry Lamy, Grenoble (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 236 days.

(21) Appl. No.: 13/124,451

(22) PCT Filed: Oct. 16, 2009

(86) PCT No.: PCT/FR2009/051986
§ 371 (c)(1),
(2), (4) Date: Jul. 7, 2011

(87) PCT Pub. No.: WO2010/043831
PCT Pub. Date: Apr. 22, 2010

(65) Prior Publication Data
US 2011/0260621 A1    Oct. 27, 2011

(30) Foreign Application Priority Data
Oct. 17, 2008 (FR) ...................................... 08 57068

(51) Int. Cl.
*H05H 1/40* (2006.01)
*H05H 1/24* (2006.01)

(52) U.S. Cl.
USPC ............. 315/111.41; 315/111.21; 315/111.71

(58) Field of Classification Search
USPC ........................................ 315/111.01, 41, 71
See application file for complete search history.

(56) References Cited

U.S. PATENT DOCUMENTS

| | | | | |
|---|---|---|---|---|
| 4,266,167 A * | 5/1981 | Proud et al. | .................... | 315/248 |
| 5,180,948 A | 1/1993 | Heinemann | | |
| 5,565,738 A * | 10/1996 | Samukawa et al. | ...... | 315/111.51 |
| 5,936,352 A * | 8/1999 | Samukawa et al. | ...... | 315/111.51 |
| 6,343,565 B1 * | 2/2002 | Hongoh | ................ | 118/723 MW |
| 6,348,669 B1 * | 2/2002 | Rudd Little et al. | ..... | 219/121.43 |
| 6,356,026 B1 * | 3/2002 | Murto | ....................... | 315/111.81 |
| 7,176,844 B2 * | 2/2007 | Chiang et al. | ................. | 343/815 |
| 7,819,981 B2 * | 10/2010 | DiMeo et al. | .................. | 134/1.2 |
| 7,976,674 B2 * | 7/2011 | Brcka | ....................... | 156/345.48 |

FOREIGN PATENT DOCUMENTS

FR    2884043 A    10/2006
JP    9245658 A    9/1997

OTHER PUBLICATIONS

Nakagawa et al., New plasma source with an UHF (500 MHz) antenna, Thin Solid Films 281-282, p. 169-171, Elsevier, 1996.*
Werner et al., Slot antenna 2.45 GHz microwave plasma source, Plasma Sources Sci. Technol. 3 (1994) p. 473-481.*
Written Opinion of the International Searching Authority issued on May 25, 2011.
International Search Report issued in PCT/FR2009/051986.

(Continued)

*Primary Examiner* — Shawki Ismail
*Assistant Examiner* — Nelson Correa
(74) *Attorney, Agent, or Firm* — Vedder Price PC

(57) ABSTRACT

A plasma source includes a first rod forming a quarterwave antenna, surrounded by at least one parallel rod forming a coupler and which is substantially the same length as the first rod, set to a reference potential, the coupler rods being evenly distributed radially about the first rod, at a distance of around one-fifth to one-twentieth of the quarter of the wavelength.

9 Claims, 4 Drawing Sheets

(56) References Cited

OTHER PUBLICATIONS

"Effect of Anode and Insulator Materials on Plasma Focus Sheath (Pinch) Current", Shyam A., et al., IEEE Transactions on Plasma Science, IEEE Service Center, Piscataway NJ vol. 25, No. 5, Oct. 9, 1997, XP011044927.

"Electron Cyclotron Resonance Applicator of the Wilkinson Microwave Power Divider Type for Large Diameter Ion Sources", Fusellier, C., et al., Review of Scientific Instruments, AIP, Melville, NY, US, vol. 69, No. 2, Feb. 1, 1998, pp. 843-845, XP0112036380.

* cited by examiner

M1 : 14 kV/m
M2 : 3 kV/m

M1 : 40 kV/m
M2 : 1,3 kV/m

M1 : 28 kV/m
M2 : 0,8 kV/m

M1 : 21 kV/m
M2 : 0,3 kV/m

M1 : 17 kV/m
M2 : 0,2 kV/m

M1 : 16 kV/m
M2 : 0,2 kV/m 2,45 GHz 2,51 GHz 2,48 GHz 2,45 GHz 2,42 GHz 2,39 GHz

LOW-POWER GASEOUS PLASMA SOURCE

FIELD OF THE INVENTION

The present invention relates to a gaseous plasma source and more specifically to a source in which the plasma is obtained by interaction between a high-frequency electromagnetic radiation and a low-pressure gas.

DISCUSSION OF PRIOR ART

It is known that by applying an electromagnetic radiation to a low-pressure gas, the gas may be ionized and form a plasma in an area where the high-frequency electromagnetic field has a sufficient intensity. Given plasma ignition and sustain conditions (Paschen conditions), it is generally necessary to use a relatively powerful high-frequency source, and the use of magnetrons are generally used. Magnetrons have the advantage of being able to provide strong powers (on the order of from 10 to 100 watts rms or more) at a reasonable cost, which makes it easier to obtain ignition conditions. However, the transport and the adaptation of this power between the magnetron and the area where the plasma is desired to be created induce strong dimensional and technical constraints, such as the dimension of the waveguides, cooling systems, vacuum processings, etc.

Further, high-frequency sources (in the field of centimetric waves, of a frequency ranging from 0.4 to 10 GHz) using transistor oscillators are known. Such sources, widely used in the field of cell phones and of WIFI communication systems, are now cost-effective and of low bulk in the case where their power is lower than 10 watts (for example, within the range from 0.2 to 5 watts).

Once a plasma source is available, many applications are possible for such a source. For example, it may effectively be used as a plasma source for the processing of materials arranged in the immediate vicinity of the plasma creation area. It may also be used as a light source. It may also be used as a source of ions which are extracted from the plasma creation area.

The present invention aims at forming a plasma source which avoids at least some of the disadvantages of existing devices.

A more specific object of an embodiment of the present invention is to provide a plasma source that may be excited by a high-frequency transistor oscillator.

Another object of an embodiment of the present invention is to form a plasma source of small dimensions.

Another object of an embodiment of the present invention is to form a flexible plasma source.

Another object of an embodiment of the present invention is to form plasma sources that may be assembled in a panel to form a plasma, source of large surface area.

Another object of an embodiment of the present invention is to form a plasma source which is particularly well adapted to the forming of a light source.

Another object of an embodiment of the present invention is to form a plasma source which is particularly well adapted to the forming of an ion source.

SUMMARY

To achieve all or part of these and other objects, an embodiment of the present invention provides a plasma source comprising a first rod forming a quarter-wave antenna surrounded with at least one parallel rod forming a coupler, substantially of same length as the first rod, set to a reference voltage, the coupler-forming rods being regularly distributed, radially, around the first rod, at a distance varying from approximately half to one twentieth of the quarter of the wavelength.

According to an embodiment of the present invention, the plasma source is associated with a high-frequency generator in the range from 0.4 to 10 GHz, formed of an HF transistor oscillator.

According to an embodiment of the present invention, the above plasma source is applied to the forming of a light source, wherein the source comprises three couplers.

According to an embodiment of the present invention, the plasma source is surrounded with a transparent conductive enclosure.

According to an embodiment of the present invention, the plasma source is surrounded with an insulating enclosure coated with a conductive mesh.

According to an embodiment of the present invention, the above plasma source is applied to the placing of a substrate in the presence of a plasma, the ends of the rods being placed in an axial magnetic field, the source being arranged at a small distance from the substrate, the assembly being enclosed in an vacuum atmosphere selected according to the atomic species which are desired to be created in the plasma.

According to an embodiment of the present invention, the above plasma source is applied to the forming of an ion implanter, the chamber surrounding the three rods being a metal chamber, comprising a plane parallel to the end of the rods pierced with an opening and arranged opposite to accelerating electrodes.

According to an embodiment of the present invention, an extensive plasma source comprising an assembly of elementary plasma sources such as hereabove arranged side by side is provided, each elementary source being associated with a high-frequency transistor oscillator.

According to an embodiment of the present invention, in the extensive plasma source, same magnets apply an axial field to elementary adjacent plasma sources.

BRIEF DESCRIPTION OF THE DRAWINGS

The foregoing and other objects, features, and advantages of the present invention will be discussed in detail in the following non-Limiting description of specific embodiments in connection with the accompanying drawings.

DETAILED DESCRIPTION

Figure 1A:
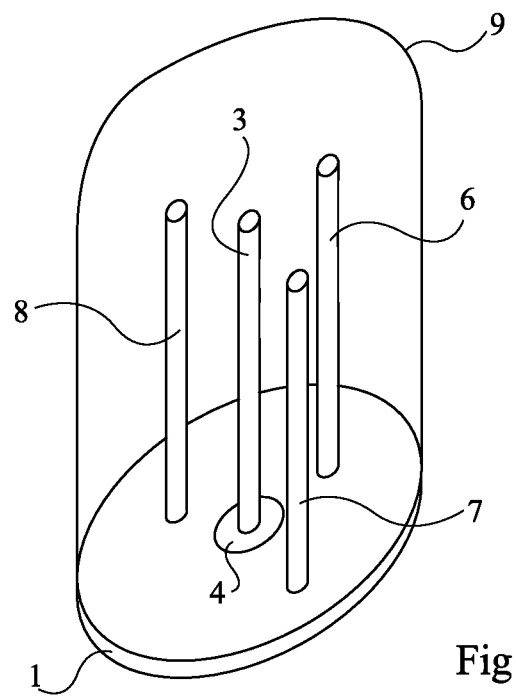
FIGS. 1A, 1B and 1C respectively show a perspective view, a front view, and a cross-section view along line CC of FIG. 1B of a plasma source according to an embodiment of the present invention used as a light source.
Figure 1B:
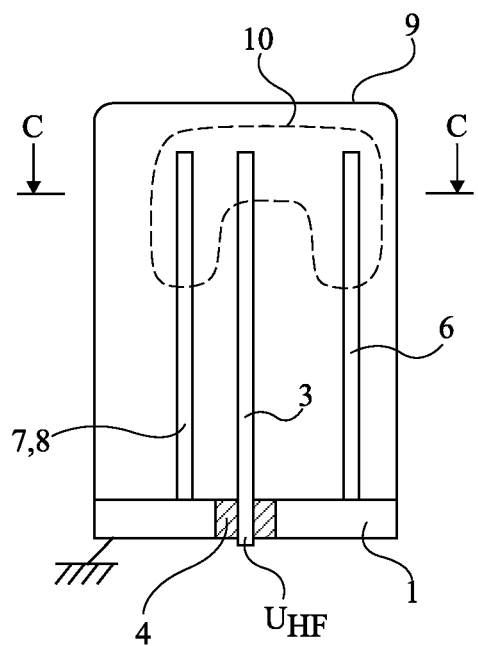
Figure 1C:
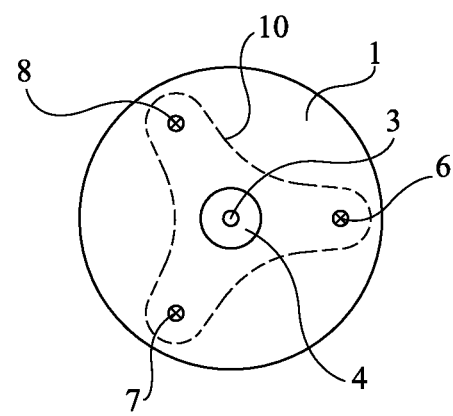
Figure 2A:
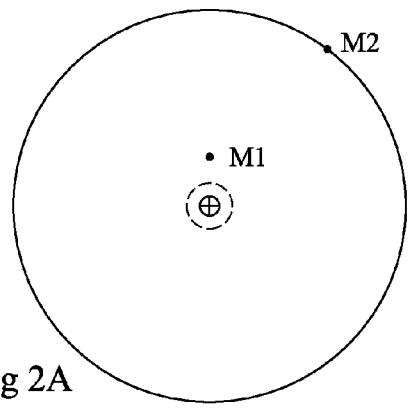
FIGS. 2A to 2F show equipotential lines for various plasma source configurations, in the case where the gas in which the plasma is created is enclosed in an enclosure made of an insulating material.
Figure 2B:
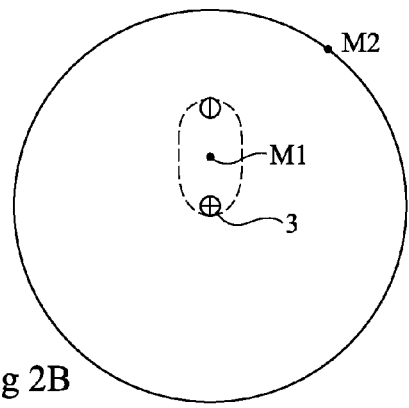
Figure 2C:
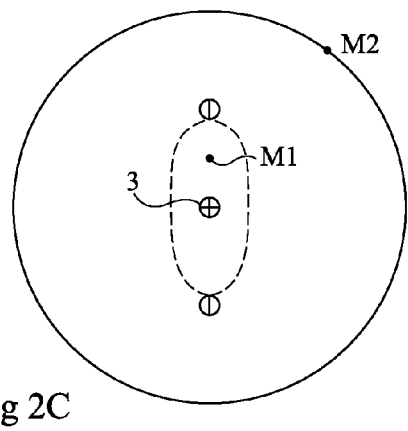
Figure 2D:
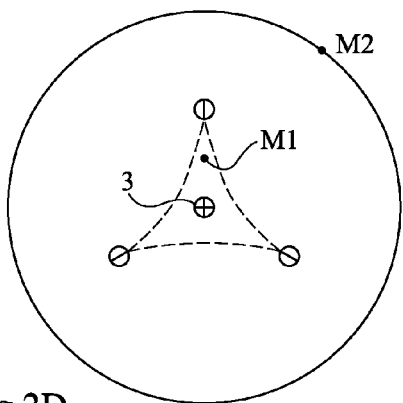
Figure 2E:
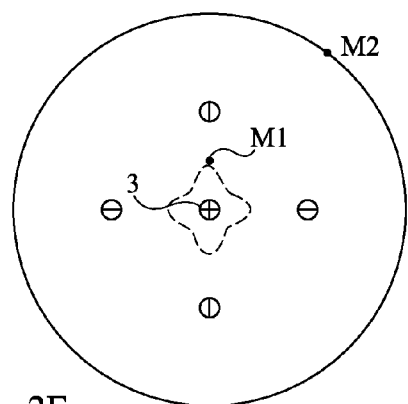
Figure 2F:
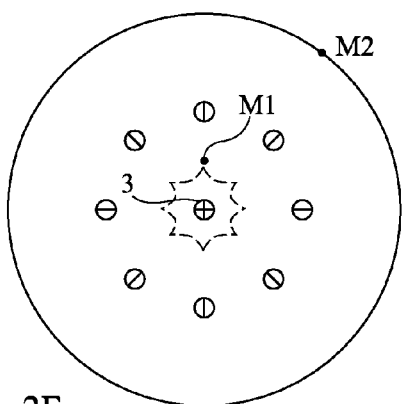
Figure 3A:
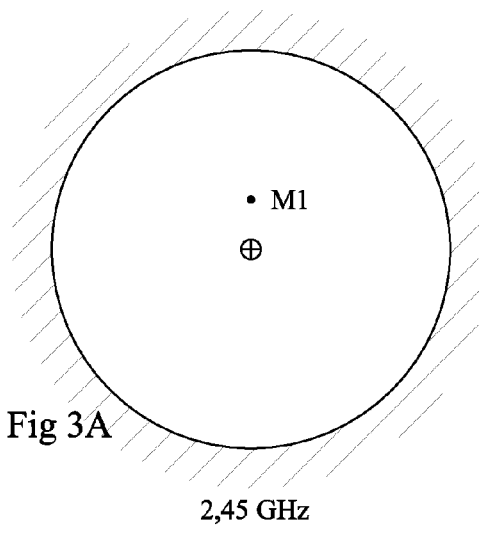
FIGS. 3A to 3F show equipotential lines for various plasma source configurations, in the case where the gas in which the plasma is created is enclosed in an enclosure made of a conductive material.
Figure 3B:
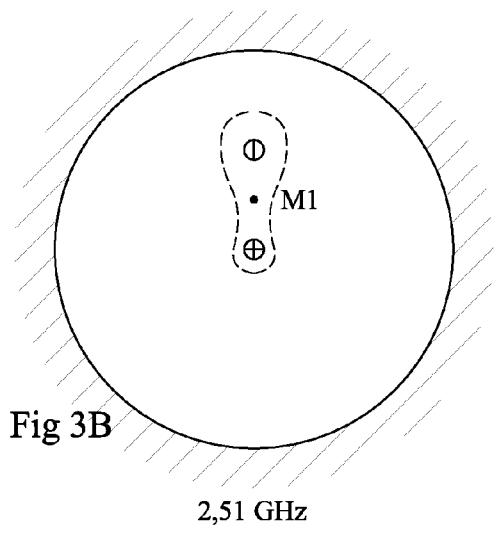
Figure 3C:
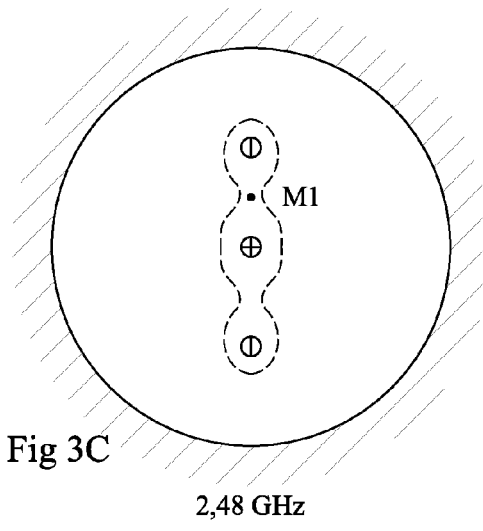
Figure 3D:
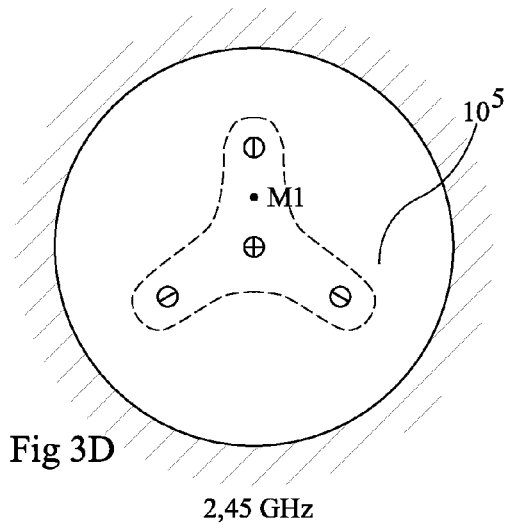
Figure 3E:
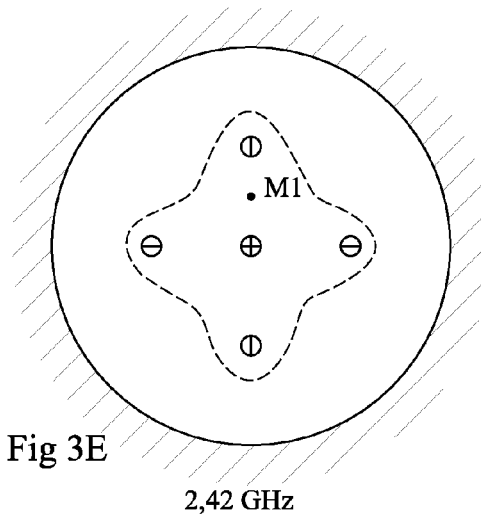
Figure 3F:
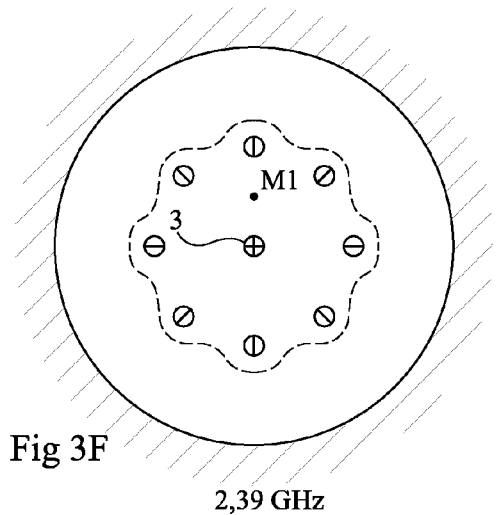

FIGS. 1A, 1B, and 1C show a plasma source comprising, in a vacuum enclosure, on a support 1, a central rod 3 forming a substantially quarter-wave antenna at the considered frequency, for example a frequency approximately ranging from 2.4 to 5.8 GHz. Thus, if the frequency is on the order of 2.4 GHz, the quarter of the wavelength, $\lambda/4$, has a value on the order of 3 cm, which corresponds to the length of rod 3. This rod is isolated from the support by an area 4 and is excited by a high-frequency voltage $U_{HF}$. Rod 3 is surrounded with three equidistant and regularly distributed rods 6, 7, 8 substantially having the same length as the central rod and behaving as couplers. These three rods are connected to a D.C. reference voltage, for example, a ground plane formed by support 1. It should be noted that, in the representation of FIG. 1B, rod 8, placed behind rod 7, is not visible. As an example, this plasma source has been illustrated as arranged in a transparent enclosure 9, for example, made of quartz, to form a light source.

The radial distance between each of rods 6, 7, 8 forming couplers and the central rod forming an antenna 3 is small as compared with the quarter of the wavelength, for example, approximately from 5 to 15 times smaller than the quarter of the wavelength, preferably approximately ten times smaller than the quarter of the wavelength. Thus, in the example where the quarter of the wavelength is 3 cm, the radial distance between each of the coupler rods and the antenna-forming rod will for example be selected to be on the order of 3 mm.

With this structure, it can be acknowledged that, when the antenna-forming rod is excited, a plasma forms in an area substantially delimited by dotted line contour 10 (see FIGS. 1B and 1C). The plasma area is located towards the ends of the rods opposite to support 1 and mainly extends from central rod 3 to the three couplers 6, 7, 8. This indicates that there is a concentration of the high-frequency field in this area 10. Due to this local character of the field, a relatively low power may be used for the plasma ignition and sustaining. While, typically, to reach the plasma creation conditions (the Paschen conditions), an HF power on the order of from 5 to 15 watts must be applied to a normally radiating quarter-wave antenna, it can be acknowledged that, here, a relatively low power ranging from 0.5 to 2 watts is sufficient to ignite the plasma, which is sustained for a power smaller than one watt. It is considered that a 20 kV/m field over 2.5 mm is a typical ignition threshold for hydrogen in the absence of a magnetic field.

This structure thus has a significant advantage, that is, the antenna may be excited by a source of relatively low power such as a high-frequency transistor oscillator, of the type currently used in cell phones. As a result, the plasma source and its excitation system may be of small volume and of low bulk. In spite of this, in the plasma area, the plasma is very intense and a very bright light source is obtained.

In the operation as a light source, gases such as argon/mercury or xenon/mercury or deuterium may be used. An advantage of this embodiment of the invention is that the HF excitation source and the lamp may operate with no cooling like a low-consumption lamp.

More generally, the present invention aims at a plasma generation system comprising a quarter-wave antenna associated with one or several couplers arranged at a short distance from said antenna.

FIGS. 2A to 2F show equipotential lines for various plasma source configurations, in the case where the gas in which the plasma is created is enclosed in an enclosure made of an insulating material. The system is then said to be open. Such a system is non-resonant. Configurations associating with a substantially quarter wave antenna 3 respectively 0, 1, 2, 3, 4 and 8 couplers in the form of quarter-wave rods are considered. The case where the couplers, when present, are at a radial distance on the order of one tenth of the quarter of the wavelength ($\lambda/40$) of the antenna is considered. The field is considered, on the one hand, at a point M1 located at a distance $\lambda/80$ from the antenna in the direction of a coupler, when present, and on the other hand, at a point M2 on the housing used to enclose the gas in which a plasma may be created. In this example, point M2 is at a radial distance of approximately $\lambda/10$ from the antenna.

FIGS. 2A to 2F correspond to cross-section views in a plane located 2 mm away from the end of the antennas and couplers, each of which has a 2.5-mm diameter and a 27-mm height. In each case, it is considered that the antenna is excited at a 5-watt power at a 2.45-GHz frequency.

In each of FIGS. 2A to 2F, the field line at 20 kV/m has been shown with a dotted line, which means that, within the dotted line contour, the field is greater than this value. Table I hereafter indicates the values (in kV/m) of the fields at points M1 and M2 in each of the cases.

TABLE I

Fields in M1 and M2 in kV/m-isolating enclosure

| | Number of couplers | | | | |
|---|---|---|---|---|---|
| 0 | 1 | 2 | 3 | 4 | 8 |
| M1 | 14 | 40 | 28 | 21 | 17 | 16 |
| M2 | 3 | 1.3 | 0.8 | 0.3 | 0.2 | 0.2 |

To have an efficient light source, the maximum field must be sufficiently high to enable to ignite a plasma (greater than 20 kV/m over approximately 2.5 mm), and for the field radiated outside of the enclosure, beyond M2, to be as low as possible to respect electromagnetic radiation standards.

It can thus be acknowledged that the system with one antenna and three couplers is one of the best possible compromises, given that their exists an intense field area, greater than 20 kV/m, located substantially within a triangle delimited by the three couplers, and on the other hand that the field within the enclosure is very low, below 0.3 kV/m. On the other hand, to form a lamp, the couplers must shield as little as possible the light radiation, which is the case when only three couplers are used.

FIGS. 3A to 3F show structures in which an antenna is respectively associated with 0, 1, 2, 3, 4, and 8 couplers. This time, a conductive region is arranged on the enclosure, or forms the enclosure, or is present within the enclosure. This conductive region is preferably grounded, like the couplers. In this case, the field outside of the enclosure is zero. Such a system is said to be closed and is resonant.

The drawings correspond to a case where the applied power is 1 watt only and the frequency is close to 2.45 GHz. It should be noted that if the system is resonant for this 2.45-GHz frequency in the case of three couplers, it is respectively resonant for the 2.51, 2.48, 2.42, and 2.39 GHz frequencies for systems with 1, 2, 4, and 8 couplers.

Again, in each of FIGS. 3A to 3F, the field line at 20 kV/m has been shown in dotted lines. The field is even more concentrated than in the case of an open system and the ignition threshold is 1 W, or even 0.2 W.

As a result of the foregoing, to form a light source, a system with a central antenna and three peripheral couplers all having a substantially quarter wave length with respect to the applied high-frequency voltage ($U_{HF}$) will be preferred. Preferably, this structure will be placed in a conductive enclosure. Thus, to form a light source, it will be preferred to use a transparent conductive enclosure, for example, a quartz enclosure coated with a transparent conductive layer such as ITO set to the ground voltage. It may also be provided for the grounded peripheral conductor to be a mesh or a netting which does not hinder the propagation of light.

This conclusion must however be moderated in the case where the enclosure surrounding the plasma source is conductive. Indeed, in this case, whatever the number of couplers (≥1), if the frequency is matched around the value for which the antenna and the couplers have a substantially quarter wave length, a resonance frequency very close (to within 10%) to the frequency for which the antennas are normally calculated will always be found. This may be readily determined, experimentally and with no trials and errors by those skilled in the art, by simply varying the frequency around the initially selected frequency. Whatever the number of couplers, substantially the same fields as those which are obtained for a system with three couplers can then be obtained. This should be reminded when applications as a light source, as a direct plasma source, or as an ion source of the present invention will be specified hereafter. Indeed, depending on the application, it may be advantageous to have specific plasma shapes, for example, an extensive plasma such as obtained if a great number of couplers are provided, or a D.C. coupler ring arranged around the central antenna.

Examples of application of the present invention in the case where only three couplers are used will be given hereafter to simplify explanations and the drawings, but it should be reminded that any number of couplers may be used, especially in the case where the system is a closed system (that is, surrounded with a conductive medium).

Figure 4:
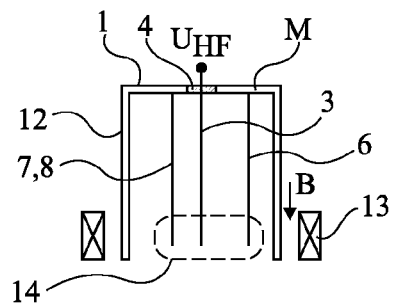
FIG. 4 is a simplified front view of a plasma source according to an embodiment of the present invention used as a plasma generator.

As illustrated in FIG. 4, the plasma source, very schematically shown, may comprise a metal enclosure 12 around antenna 3 and the three couplers 6, 7, and 8, and be open on the side of the rod ends opposite to support 1. Then, especially if a magnetic field B parallel to the rod direction is created by a magnet system 13, a plasma area 14 which extends beyond the rod ends is created. This may be used conventionally to act upon a substrate (not shown) located in front of the free end of the rods.

Figure 5:
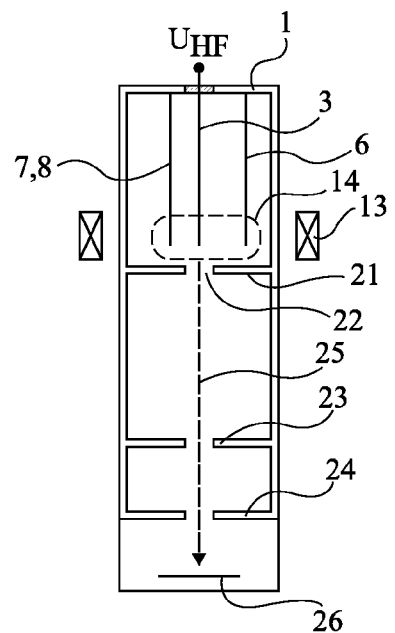
FIG. 5 is a simplified front view of a plasma source according to an embodiment of the present invention used as an ion source.

FIG. 5 very schematically illustrates an application of the plasma source of FIG. 5 to the forming of an ion source. The top portion of FIG. 5 is identical to FIG. 4. However, this time, the cavity is closed on the side of the end of antennas and couplers 3, 6, 7, 8 by a conductive plate 21 provided with an opening 22. Accelerating electrodes 23 and 24 are provided to extract ions in a beam 25 directed towards a target 26. Of course, the assembly is closed and filled with low-pressure gas or gas species from which the ion beam is desired to be formed. Further, conventionally, a monochromator, for example, a Wien filter, intended to isolate the species with which the target is desired to be bombarded, will be inserted in the ion beam travel.

It should be noted that provided to appropriately select the biasings of the various plates, an electron beam may also be extracted from the plasma.

Figure 6A:
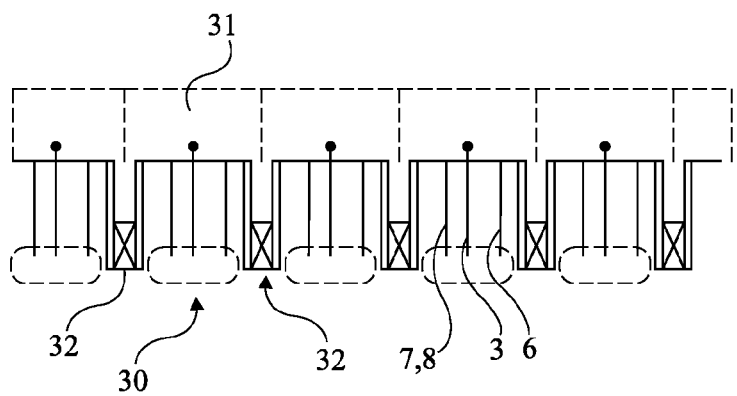
FIGS. 6A and 6B are simplified cross-section and top views of an assembly of plasma sources according to an embodiment of the present invention.
Figure 6B:
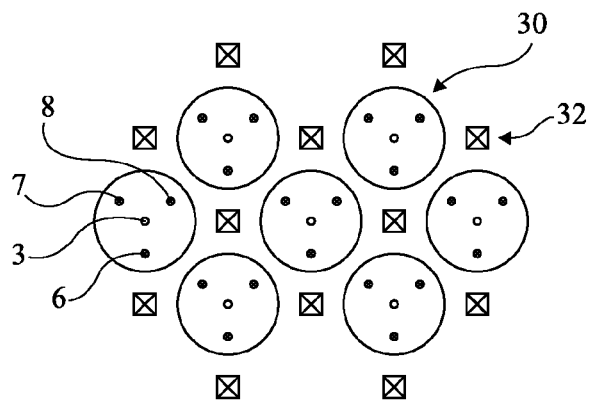

According to an aspect of an embodiment of the present invention, advantage is taken of the compactness and of the low excitation power required to form an extensive plasma source, as shown in FIGS. 6A and 6B.

FIGS. 6A and 6B show, respectively in front view and in bottom view, a side-by-side assembly of a large number of plasma cells 30, each of which for example has the structure illustrated in FIG. 4. Each of these plasma cells is associated with an RF generation oscillator with transistors shown as a block and designated with reference numeral 31. Given the involved dimensions, there is room enough to associate, with each plasma cell, an RF oscillator with transistors providing a peak power from 1 to 3 watts (for the plasma ignition) and a steady-state power approximately ranging from 0.2 to 0.5 watts. An advantage of such a cell panel structure is that magnets 32 for creating the plasma expansion field may be arranged so as to be used as magnets for two adjacent cells.

As an example, each of the cells will be a cylindrical cell having a diameter approximately ranging from 1.5 to 2.5 cm, the cells being arranged with a step approximately ranging from 2 to 4 cm.

Of course, the obtained extensive plasma source may be directly used as a plasma source or may be associated with acceleration systems of the type illustrated in FIG. 5 to form an extensive ion source, for example usable for an ion implantation on manufacturing of semiconductor components.

An advantage of associating a specific excitation oscillator with each plasma source cell is that the intensity of each plasma source can be accurately set to make them all equal or, conversely, to obtain a selected plasma density distribution profile.

Although, for simplification, only a small number of cells has been shown in FIGS. 6A and 6B, it should be noted that the structure according to the present invention is well adapted to the tiling of a large number of cells, for example, on the order of 100 or more.

The present invention has been discussed generally, but it should be noted that it is likely to have many variations. Especially, even though word "rod" has been used to designate the antenna and each of the couplers, it should be understood that each of these elements may be conductive elements or elements coated with a conductor and may for example be wires if their mechanical strength is sufficient. Such couplers may also be cylindrical elements with a non-circular cross-section to give a specific shape to the plasma area or to have an optical reflector function.

The different gases generally used in plasma sources to provide light sources, such as xenon, argon, nitrogen . . . may be used herein. In the case of plasma sources used as such or as ion sources, elements capable of providing the desired active species such as $PH_3$, $B_2H_6$, $SF_6$, $CH_4$ . . . will be incorporated into the gas.

Specific embodiments of the present invention have been described. Various alterations and modifications will occur to those skilled in the art. In particular, the dimensions have been given as an example only.

The invention claimed is:

1. A plasma source excited by a high-frequency signal comprising a first rod forming a quarter-wave antenna surrounded with at least one parallel rod forming a coupler, substantially of same length as the first rod, set to a reference voltage, the coupler-forming rods being regularly distributed, radially, around the first rod, at a distance varying from approximately half to one twentieth of the quarter of the wavelength, the antenna and the couplers being oriented in a same direction,
  wherein a plasma is locally created at ends of the rods opposite to an end of the first rod by which the first rod is supplied the high-frequency signal.

2. The plasma source of claim 1 associated with a high-frequency generator in the range from 0.4 to 10 GHz, formed of an HF transistor oscillator.

3. An application of the plasma source of claim 1 to the forming of a light source, wherein the source comprises three couplers.

4. An application of the plasma source of claim 3, wherein the plasma source is surrounded with a transparent conductive enclosure.

5. An application of the plasma source of claim 3, wherein the plasma source is surrounded with an insulating enclosure coated with a conductive mesh.

6. An application of the plasma source of claim 1 to the placing of a substrate in the presence of a plasma, wherein the ends of the rods are placed in an axial magnetic field, the source being arranged at a small distance from the substrate, the assembly being enclosed in an vacuum atmosphere selected according to the atomic species which are desired to be created in the plasma.

7. An application of the plasma source of claim 6 to the forming of an ion implanter, wherein the chamber surrounding the three rods is a metal chamber, comprising a plane parallel to the end of the rods pierced with an opening and arranged opposite to accelerating electrodes.

8. An extensive plasma source comprising an assembly of elementary plasma sources according to claim 1 arranged side by side, each elementary source being associated with a high-frequency transistor oscillator.

9. The extensive plasma source of claim 8, wherein magnets apply an axial field to adjacent elementary plasma sources.

* * * * *